United States Patent
Kozuka et al.

(10) Patent No.: US 10,347,817 B2
(45) Date of Patent: *Jul. 9, 2019

(54) LEAD-FREE PIEZOELECTRIC CERAMIC COMPOSITION, PIEZOELECTRIC ELEMENT USING THE SAME, AND METHOD OF MANUFACTURING LEAD-FREE PIEZOELECTRIC CERAMIC COMPOSITION

(71) Applicant: NGK SPARK PLUG CO., LTD., Nagoya-shi, Aichi (JP)

(72) Inventors: Hisashi Kozuka, Ichinomiya (JP); Hideto Yamada, Komaki (JP); Takayuki Matsuoka, Aichi (JP); Kazuaki Kitamura, Ise (JP); Masato Yamazaki, Komaki (JP); Toshiaki Kurahashi, Konan (JP); Takashi Kasashima, Ichinomiya (JP); Yasuyuki Okimura, Inuyama (JP); Kazushige Ohbayashi, Nagoya (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 254 days.

This patent is subject to a terminal disclaimer.

(21) Appl. No.: 15/129,943

(22) PCT Filed: Mar. 5, 2015

(86) PCT No.: PCT/JP2015/001199
§ 371 (c)(1),
(2) Date: Sep. 28, 2016

(87) PCT Pub. No.: WO2015/155933
PCT Pub. Date: Oct. 15, 2015

(65) Prior Publication Data
US 2017/0141293 A1    May 18, 2017

(30) Foreign Application Priority Data

Apr. 11, 2014  (JP) .................................. 2014-081771
Dec. 9, 2014  (JP) .................................. 2014-248978

(51) Int. Cl.
  *H01L 41/18*  (2006.01)
  *H01L 41/187*  (2006.01)
  (Continued)

(52) U.S. Cl.
  CPC ........ *H01L 41/1873* (2013.01); *C04B 35/495* (2013.01); *C04B 35/64* (2013.01);
  (Continued)

(58) Field of Classification Search
  CPC .................................................. H01L 41/1873
  (Continued)

(56) References Cited

U.S. PATENT DOCUMENTS 6,387,295 B1  3/2002  Saito
2002/0036282 A1  3/2002  Chiang et al.
(Continued)

FOREIGN PATENT DOCUMENTS

CN  103649008 A  3/2014
JP  2000-313664 A  11/2000
(Continued)

OTHER PUBLICATIONS

Communication dated Jul. 3, 2018, issued by the Chinese Patent Office in counterpart Chinese Application No. 201580019360.9.
(Continued)

*Primary Examiner* — Thomas M Dougherty
*Assistant Examiner* — Karen B Addison
(74) *Attorney, Agent, or Firm* — Sughrue Mion, PLLC

(57) ABSTRACT

A lead-free piezoelectric ceramic composition including an alkali niobate/tantalate perovskite oxide main phase having
(Continued)

piezoelectric properties and a different metal oxide. The mole ratio (Na/K) between Na (sodium) and K (potassium) in the main phase is 0.40<(Na/K)<3.0. The main phase has a crystal structure in which (i) first spots corresponding to a primitive lattice period and (ii) second spots corresponding to the lattice period two times the primitive lattice period and being weaker than the first spots appear in an electron beam diffraction image entering from the <100> direction with the main phase represented as a pseudo-cubic crystal system. Also, the area ratio of a crystal phase reflecting the second spots in the main phase is 33% or less, and the maximum grain size of crystals reflecting the second spots in the main phase is 25 nm or less.

7 Claims, 14 Drawing Sheets

(51) Int. Cl.
*H01L 41/43* (2013.01)
*C04B 35/495* (2006.01)
*C04B 35/64* (2006.01)
*H01L 41/047* (2006.01)

(52) U.S. Cl.
CPC ............ *H01L 41/047* (2013.01); *H01L 41/43* (2013.01); *C04B 2235/3201* (2013.01); *C04B 2235/3203* (2013.01); *C04B 2235/3206* (2013.01); *C04B 2235/3208* (2013.01); *C04B 2235/3213* (2013.01); *C04B 2235/3215* (2013.01); *C04B 2235/3225* (2013.01); *C04B 2235/3232* (2013.01); *C04B 2235/3244* (2013.01); *C04B 2235/3255* (2013.01); *C04B 2235/3262* (2013.01); *C04B 2235/3267* (2013.01); *C04B 2235/3272* (2013.01); *C04B 2235/3277* (2013.01); *C04B 2235/3279* (2013.01); *C04B 2235/3284* (2013.01); *C04B 2235/3286* (2013.01); *C04B 2235/604* (2013.01); *C04B 2235/768* (2013.01); *C04B 2235/79* (2013.01); *C04B 2235/80* (2013.01); *C04B 2235/96* (2013.01)

(58) Field of Classification Search
USPC ........................................ 310/358, 252.9 PZ
See application file for complete search history.

(56) References Cited

U.S. PATENT DOCUMENTS

| | | | |
|---|---|---|---|
| 2003/0176273 | A1 | 9/2003 | Yamagiwa et al. |
| 2003/0178605 | A1 | 9/2003 | Nonoyama et al. |
| 2012/0146462 | A1 | 6/2012 | Yamazaki et al. |
| 2014/0027666 | A1 | 1/2014 | Kikuta et al. |
| 2014/0028156 | A1 | 1/2014 | Shimizu et al. |
| 2014/0139070 | A1 | 5/2014 | Yamazaki et al. |
| 2017/0151293 | A1* | 6/2017 | Kovarik ............... A61K 35/747 |

FOREIGN PATENT DOCUMENTS

| | | | |
|---|---|---|---|
| JP | 2003-2743 | A | 1/2003 |
| JP | 2003-342069 | A | 12/2003 |
| JP | 2010-103301 | A | 5/2010 |
| JP | 2010-275131 | A | 12/2010 |
| JP | 2014-024698 | A | 2/2014 |
| JP | 2014-26998 | A | 2/2014 |
| WO | 01/077501 | A2 | 10/2001 |
| WO | 2011/093021 | A1 | 8/2011 |

OTHER PUBLICATIONS

Communication dated Apr. 17, 2018, issued by the Japanese Patent Office in counterpart Japanese application No. 2014-248976.
Jason Schiemer, et al., "Ferroelectric and octahedral tilt twin disorder and the lead-free piezoelectric, sodium potassium niobate system", Journal of Solid State Chemistry, vol. 195, 2012, pp. 55-62.
International Search Report for PCT/JP2015/001199 dated May 26, 2016 [PCT/ISA/210].
Written Opinion for PCT/JP2015/001199 dated May 26, 2016 [PCT/ISA/237].

* cited by examiner

FIG. 4A

Effects of Na/K ratio of main phase (1)

| Sample | Element C | Element D | Element E | Main phase a | b | Na/K ratio b/a | c | Factor d of element D d1 | d2 | e | Factor f of element f1 | f2 | f3 | Factor g of element E g1 | g2 | Subphase Component | Percentage (Vol.%) | Occupancy percentage in firing sheath (Vol.%) | Na/K ratio b/a (analyzed value) |
|---|---|---|---|---|---|---|---|---|---|---|---|---|---|---|---|---|---|---|---|
| S01 | Ca, Ba | Nb, Ti, Zr | – | 0.466 | 0.441 | 0.95 | 0.021 | 0.037 | 0.036 | 1.070 | 0.937 | 0.038 | 0.026 | – | – | | 0.98 | 16 | 0.85 |
| S02 | Ca, Ba | Nb, Ti, Zr | – | 0.392 | 0.514 | 1.31 | 0.021 | 0.037 | 0.036 | 1.070 | 0.937 | 0.038 | 0.026 | – | – | | 1.32 | 29 | 1.13 |
| S03 | Ca, Ba | Nb, Ti, Zr | – | 0.319 | 0.587 | 1.84 | 0.021 | 0.037 | 0.036 | 1.070 | 0.937 | 0.038 | 0.026 | – | – | | 1.48 | 16 | 1.69 |
| S04 | Ca, Ba | Nb, Ti, Zr | – | 0.417 | 0.490 | 1.17 | 0.021 | 0.037 | 0.036 | 1.070 | 0.937 | 0.038 | 0.026 | – | – | | 1.11 | 7.0 | 1.03 |
| S05 | Ca, Ba | Nb, Ti, Zr | – | 0.368 | 0.539 | 1.46 | 0.021 | 0.037 | 0.036 | 1.070 | 0.937 | 0.038 | 0.026 | – | – | Co$_3$O$_4$ ZnO Fe$_2$O$_3$ | 1.51 | 16 | 1.40 |
| S06 | Ca, Ba | Nb, Ti, Zr | – | 0.613 | 0.294 | 0.48 | 0.021 | 0.037 | 0.036 | 1.070 | 0.937 | 0.038 | 0.026 | – | – | | 1.34 | 16 | 0.45 |
| S07 | Ca, Ba | Nb, Ti, Zr | – | 0.539 | 0.367 | 0.68 | 0.021 | 0.037 | 0.036 | 1.070 | 0.937 | 0.038 | 0.026 | – | – | | 1.25 | 16 | 0.59 |
| S08 | Ca, Ba | Nb, Ti, Zr | – | 0.455 | 0.458 | 1.01 | 0.015 | 0.036 | 0.036 | 1.070 | 0.937 | 0.038 | 0.026 | – | – | | 1.58 | 16 | 1.01 |
| S09 | Ca, Ba | Nb, Ti, Zr | – | 0.455 | 0.457 | 1.01 | 0.015 | 0.036 | 0.036 | 1.055 | 0.937 | 0.038 | 0.026 | – | – | | 1.50 | 1.5 | 1.02 |
| S10 | Ca, Ba | Nb, Ti, Zr | – | 0.448 | 0.458 | 1.02 | 0.021 | 0.037 | 0.036 | 1.070 | 0.943 | 0.039 | 0.019 | – | – | | 1.39 | 16 | 1.00 |
| S11 | Ca, Ba | Nb, Ti, Zr | – | 0.449 | 0.457 | 1.02 | 0.021 | 0.037 | 0.036 | 1.070 | 0.941 | 0.039 | 0.021 | – | – | | 1.35 | 16 | 1.03 |
| S12 | Ca, Ba | Nb, Ti, Zr | – | 0.404 | 0.508 | 1.26 | 0.015 | 0.036 | 0.036 | 1.070 | 0.937 | 0.037 | 0.026 | – | – | | 1.27 | 16 | 1.29 |
| S13 | Ca, Ba | Nb, Ti, Zr | – | 0.321 | 0.591 | 1.84 | 0.015 | 0.036 | 0.036 | 1.070 | 0.937 | 0.037 | 0.026 | – | – | | 1.54 | 8.0 | 1.45 |
| S14 | Ca, Ba | Nb, Ti, Zr | – | 0.401 | 0.511 | 1.27 | 0.016 | 0.036 | 0.036 | 1.070 | 0.941 | 0.038 | 0.021 | – | – | | 1.10 | 16 | 1.25 |
| S15 | Ca, Ba | Nb, Ti, Zr | – | 0.399 | 0.502 | 1.26 | 0.015 | 0.036 | 0.048 | 1.070 | 0.925 | 0.037 | 0.026 | – | – | | 1.36 | 16 | 1.23 |
| S16 | Ca, Ba | Nb, Ti, Zr | – | 0.317 | 0.584 | 1.84 | 0.015 | 0.036 | 0.048 | 1.070 | 0.925 | 0.037 | 0.026 | – | – | | 1.32 | 13 | 1.74 |
| S17 | Ca, Ba | Nb, Ti, Zr | – | 0.241 | 0.665 | 2.75 | 0.021 | 0.037 | 0.036 | 1.070 | 0.937 | 0.038 | 0.026 | – | – | | 1.64 | 16 | 2.60 |
| S18 | Ca, Ba | Nb, Ti, Zr | – | 0.444 | 0.446 | 1.01 | 0.025 | 0.036 | 0.048 | 1.070 | 0.925 | 0.037 | 0.026 | – | – | | 1.48 | 16 | 1.05 |
| S19 | Ca, Ba | Nb, Ti, Zr | – | 0.351 | 0.544 | 1.55 | 0.020 | 0.037 | 0.048 | 1.070 | 0.925 | 0.037 | 0.026 | – | – | | 1.62 | 16 | 1.51 |
| S20 | Ca, Ba | Nb, Ti, Zr | – | 0.360 | 0.558 | 1.55 | 0.021 | 0.037 | 0.024 | 1.070 | 0.949 | 0.038 | 0.026 | – | – | | 1.19 | 16 | 1.57 |
| S21 | Ca, Ba | Nb, Ti, Zr | – | 0.455 | 0.456 | 1.00 | 0.015 | 0.037 | 0.036 | 1.070 | 0.936 | 0.038 | 0.028 | – | – | | 1.46 | 16 | 1.01 |
| S22 | Ca, Ba | Nb, Ti, Zr | – | 0.349 | 0.547 | 1.57 | 0.031 | 0.037 | 0.036 | 1.070 | 0.941 | 0.038 | 0.021 | – | – | | 1.22 | 16 | 1.49 |

FIG. 4B

Effects of Na/K ratio of main phase (2)

| Sample | Element C | Element D | Element E | Main phase | | | | | | | | | | | | Subphase | | Occupancy percentage in firing sheath (Vol. %) | Na/K ratio b/a (analyzed value) |
|---|---|---|---|---|---|---|---|---|---|---|---|---|---|---|---|---|---|---|---|
| | | | | a | b | Na/K ratio b/a | c | Factor d of element C | | e | Factor f of element D | | | Factor g of element E | | Component | Percentage (Vol. %) | | |
| | | | | | | | | d1 | d2 | | f1 | f2 | f3 | g1 | g2 | | | | |
| S101(*) | Ca, Ba | Nb, Ti, Zr | – | 0.221 | 0.685 | 3.10 | 0.021 | 0.037 | 0.036 | 1.070 | 0.937 | 0.038 | 0.026 | – | – | | 1.43 | 16 | 3.01 |
| S102(*) | Ca, Ba | Nb, Ti, Zr | – | 0.906 | 0.000 | 0.00 | 0.021 | 0.037 | 0.036 | 1.070 | 0.937 | 0.038 | 0.026 | – | – | Co$_3$O$_4$ ZnO Fe$_2$O$_3$ | 1.75 | 16 | 0 |
| S103(*) | Ca, Ba | Nb, Ti, Zr | – | 0.368 | 0.539 | 1.46 | 0.021 | 0.037 | 0.036 | 1.070 | 0.937 | 0.038 | 0.026 | – | – | | 1.37 | 0.5 | 1.43 |
| S104(*) | Ca, Ba | Nb, Ti, Zr | – | 0.368 | 0.539 | 1.46 | 0.021 | 0.037 | 0.036 | 1.070 | 0.937 | 0.038 | 0.026 | – | – | | 1.50 | 40 | 1.45 |
| S105(*) | Ca, Ba | Nb, Ti, Zr | – | 0.683 | 0.223 | 0.33 | 0.021 | 0.037 | 0.036 | 1.070 | 0.937 | 0.038 | 0.026 | – | – | | 1.19 | 40 | 0.31 |
| S106(*) | Ca, Ba | Nb, Ti, Zr | – | 0.225 | 0.681 | 3.03 | 0.021 | 0.037 | 0.036 | 1.070 | 0.937 | 0.038 | 0.026 | – | – | | 1.56 | 16 | 3.02 |

FIG. 4C

Effects of Na/K ratio of main phase (3)

| Sample | Composition | Subphase percentage (Vol. %) | Occupancy percentage in firing sheath (Vol. %) | Na/K ratio a/b (analyzed value) | Dielectric constant $\varepsilon_{33}^T/\varepsilon_0$ | Piezoelectric constant $d_{33}$ (pC/N) | Electro-mechanical coupling factor Kr | Existence of twofold-period spots in electron beam diffraction image | Area ratio of crystal phase reflecting twofold-period spots in electron beam diffraction image (%) | Maximum grain size of crystal phase reflecting twofold-period spots in electron beam diffraction image (nm) |
|---|---|---|---|---|---|---|---|---|---|---|
| S01 | FIG. 4A | 0.98 | 16 | 0.85 | 2294 | 299 | 0.53 | Yes | 1.2 | 1.3 |
| S02 |  | 1.32 | 29 | 1.13 | 2375 | 326 | 0.55 | Yes | 20.8 | 6.5 |
| S03 |  | 1.48 | 16 | 1.69 | 2359 | 320 | 0.53 | Yes | 26.3 | 7.0 |
| S04 |  | 1.11 | 7.0 | 1.03 | 2308 | 311 | 0.56 | Yes | 4.9 | 3.9 |
| S05 |  | 1.51 | 16 | 1.40 | 2388 | 333 | 0.54 | Yes | 22.5 | 8.6 |
| S06 |  | 1.34 | 16 | 0.45 | 2264 | 287 | 0.51 | Yes | 0.6 | 0.8 |
| S07 |  | 1.25 | 16 | 0.59 | 2318 | 294 | 0.53 | Yes | 0.9 | 1.0 |
| S08 |  | 1.58 | 16 | 1.01 | 2234 | 314 | 0.53 | Yes | 1.4 | 1.3 |
| S09 |  | 1.50 | 1.5 | 1.02 | 2121 | 323 | 0.53 | Yes | 2.6 | 2.4 |
| S10 |  | 1.39 | 16 | 1.00 | 2122 | 296 | 0.52 | Yes | 1.1 | 3.0 |
| S11 |  | 1.35 | 16 | 1.03 | 2309 | 315 | 0.54 | Yes | 2.8 | 4.1 |
| S12 |  | 1.27 | 16 | 1.29 | 2316 | 325 | 0.55 | Yes | 20.4 | 4.5 |
| S13 |  | 1.54 | 8.0 | 1.45 | 2060 | 321 | 0.51 | Yes | 26.0 | 10.4 |
| S14 |  | 1.10 | 16 | 1.25 | 2084 | 350 | 0.57 | Yes | 20.5 | 4.8 |
| S15 |  | 1.36 | 16 | 1.23 | 2601 | 380 | 0.54 | Yes | 20.4 | 9.8 |
| S16 |  | 1.32 | 13 | 1.74 | 2635 | 371 | 0.51 | Yes | 26.0 | 6.4 |
| S17 |  | 1.64 | 16 | 2.60 | 2199 | 291 | 0.50 | Yes | 31.9 | 22.6 |
| S18 |  | 1.48 | 16 | 1.05 | 2436 | 331 | 0.53 | Yes | 3.3 | 3.2 |
| S19 |  | 1.62 | 16 | 1.51 | 2497 | 355 | 0.53 | Yes | 23.3 | 4.5 |
| S20 |  | 1.19 | 16 | 1.57 | 1941 | 313 | 0.53 | Yes | 23.3 | 6.5 |
| S21 |  | 1.46 | 16 | 1.01 | 2159 | 332 | 0.55 | Yes | 1.7 | 2.6 |
| S22 |  | 1.22 | 16 | 1.49 | 2023 | 303 | 0.50 | Yes | 23.5 | 11.5 |
| S101(*) | FIG. 4B | 1.43 | 16 | 3.01 | 2206 | 275 | 0.46 | No | — | — |
| S102(*) |  | 1.75 | 16 | 0 | Not densified, unmeasurable |  |  | No | — | — |
| S103(*) |  | 1.37 | 0.5 | 1.43 | Not densified, unmeasurable |  |  | No | — | — |
| S104(*) |  | 1.50 | 40 | 1.45 | 2154 | 232 | 0.41 | No | — | — |
| S105(*) |  | 1.19 | 40 | 0.31 | 1866 | 171 | 0.29 | No | — | — |
| S106(*) |  | 1.56 | 29 | 3.02 | 1101 | 199 | 0.42 | Yes | 34.2 | 30.4 |

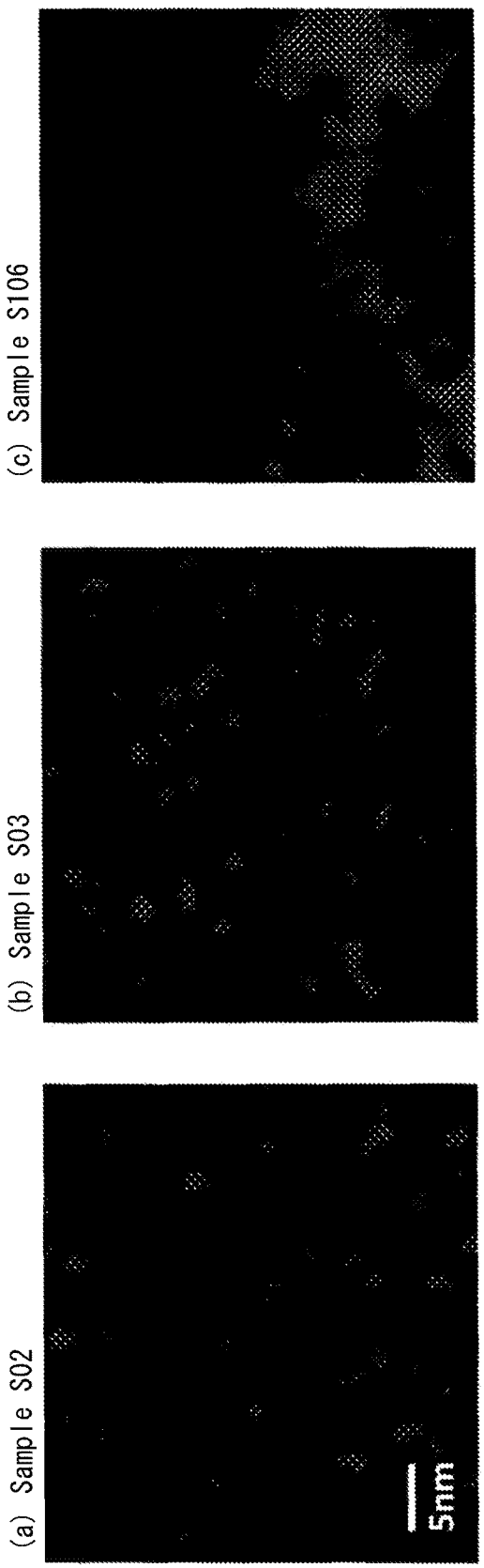

FIG. 4E

Electron beam incident orientations employed in transmission electron microscope

| Crystal system | Space group | a-, b-, and c-axis relationship | Miller indices h k l |
|---|---|---|---|
| Pseudo-cubic | Pm-3m (#221) | a ≅ b ≅ c | < 1  0  0 > |
| Monoclinic | Pm (#6) | a > c > b | [ 0  1  0 ]<br>[ 1  0  1 ]<br>[ 1  0 -1 ] |
| Tetragonal | P4mm (#99) | c > a = b | [ 1  0  0 ]<br>[ 0  1  0 ]<br>[ 0  0  1 ] |
| Orthorhombic | Imm2 (#44) | c > b > a | [ 1  0  0 ]<br>[ 0  1  0 ]<br>[ 0  0  1 ] |
| Orthorhombic | Amm2 (#38) | c > b > a | [ 1  0  0 ]<br>[ 0  1  1 ]<br>[ 0  1 -1 ] |
| Orthorhombic | Pmc21 (#26) | b > a > c | [ 0  1  0 ]<br>[ 1  0  1 ]<br>[-1  0  1 ] |
| Orthorhombic | Pmm2 (#25) | b > c > a | [ 1  0  0 ]<br>[ 0  1  0 ]<br>[ 0  0  1 ] |

FIG. 4F

Effects of firing temperature

| Sample | Composition | Firing temp. (°C) | Occupancy percentage in firing sheath (Vol. %) | Na/K ratio b/a (analyzed value by EDS) | Subphase percentage (Vol. %) | Dielectric constant $\varepsilon_{33}^T/\varepsilon_0$ | Piezoelectric constant $d_{33}$ (pC/N) | Electro-mechanical coupling factor $K_r$ | Existence of spots reflecting twofold-period of pseudo-cubic crystal system in measurement of electron beam diffraction image | Area ratio of crystal phase reflecting twofold-period spots in electron beam diffraction image in main phase (%) | Maximum grain size of crystal phase reflecting twofold-period spots in electron beam diffraction image (nm) |
|---|---|---|---|---|---|---|---|---|---|---|---|
| S17 | Same as S17 of FIG. 4A | 1120 | 16 | 2.60 | 1.64 | 2199 | 291 | 0.50 | Yes | 31.9 | 22.6 |
| S201 (*) | | 1160 | | 2.69 | 1.70 | 1569 | 250 | 0.46 | yes | 35.6 | 27.7 |
| S202 (*) | | 1200 | | 2.62 | 1.62 | 1345 | 224 | 0.44 | Yes | 37.2 | 30.3 |

FIG. 6
(A) COMPARATIVE EXAMPLE (SAMPLE S102)
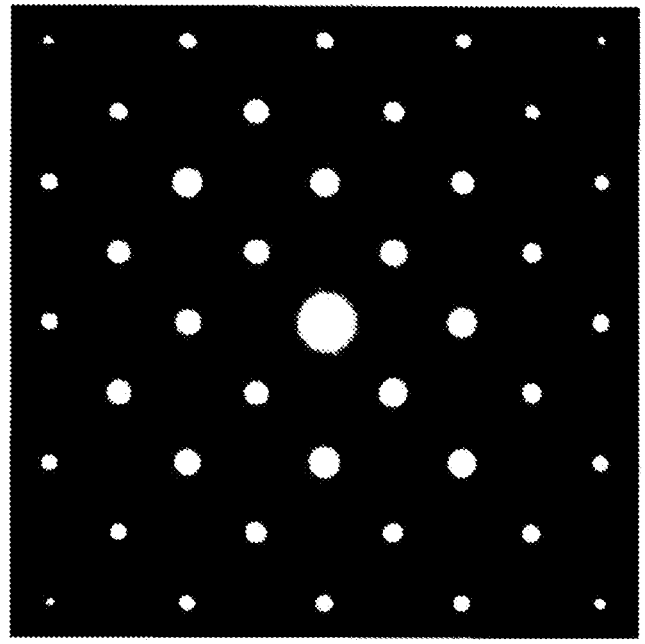
(B) EXAMPLE (SAMPLE S05)
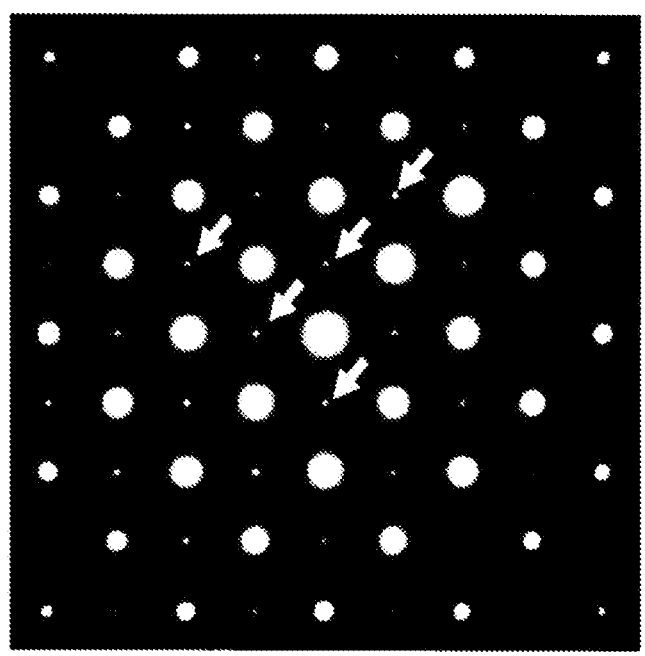

FIG. 7
(A) COMPARATIVE EXAMPLE (SAMPLE S102)
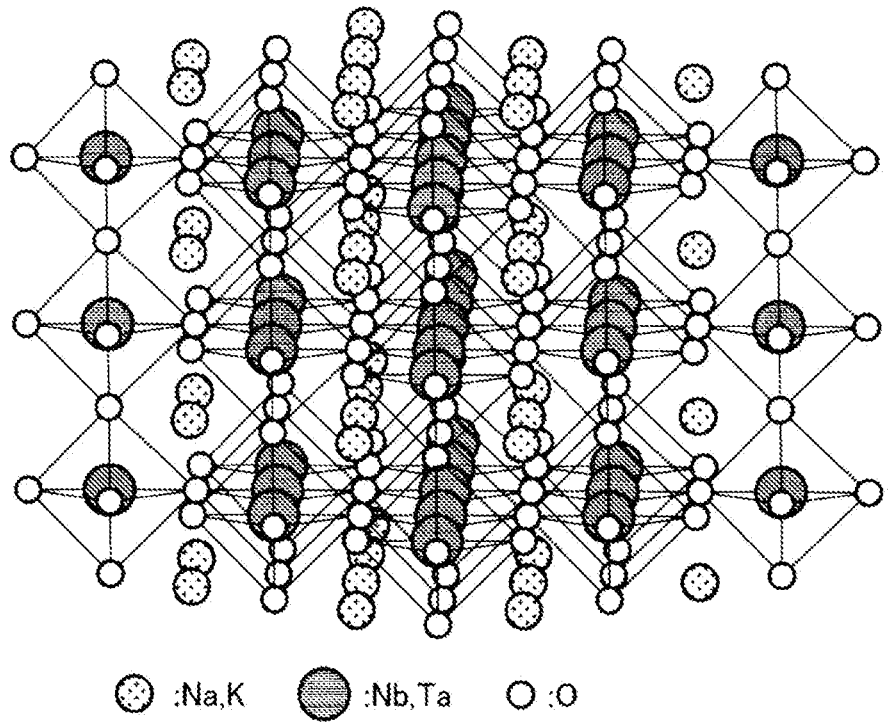
○ :Na,K   ● :Nb,Ta   ○ :O
(B) EXAMPLE (SAMPLE S05)
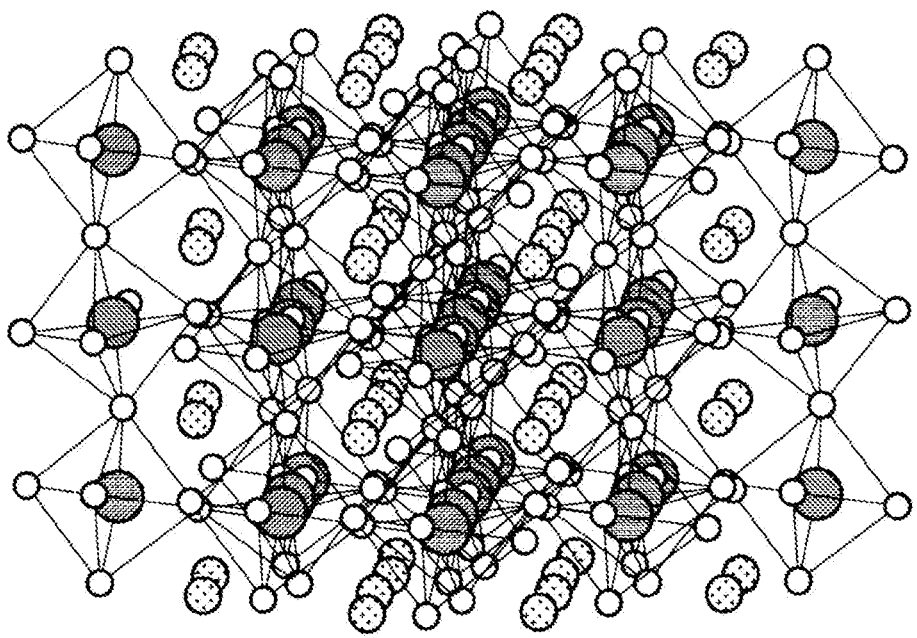

FIG. 8A

Effects of components of main phase and subphase (1)

| Sample | Main phase | | | | | | | | | | | | | | | Subphase | | Occupancy percentage in firing sheath (Vol.%) | Na/K ratio b/a (analyzed value) |
|---|---|---|---|---|---|---|---|---|---|---|---|---|---|---|---|---|---|---|---|
| | Element C | Element D | Element E | a | b | Na/K ratio b/a | c | Factor d of element C | | e | Factor f of element D | | | Factor g of element E | | Component | Percentage (Vol.%) | | |
| | | | | | | | | d1 | d2 | | f1 | f2 | f3 | g1 | g2 | | | | |
| S31 (=S05) | Ca, Ba | Nb, Ti, Zr | -- | 0.368 | 0.539 | 1.46 | 0.021 | 0.037 | 0.036 | 1.070 | 0.937 | 0.038 | 0.026 | -- | -- | Co$_3$O$_4$ ZnO Fe$_2$O$_3$ | 1.51 | 16 | 1.40 |
| S32 | Ca, Ba | Nb, Ti, Zr | -- | 0.368 | 0.539 | 1.46 | 0.021 | 0.037 | 0.036 | 1.070 | 0.937 | 0.038 | 0.026 | -- | -- | (CoZnFe)$_2$TiO$_4$ | 1.14 | 16 | 1.43 |
| S33 | Ca, Ba | Nb, Ti, Zr | -- | 0.368 | 0.539 | 1.46 | 0.021 | 0.037 | 0.036 | 1.070 | 0.937 | 0.038 | 0.026 | -- | -- | Co$_3$O$_4$ ZnO Fe$_2$O$_3$ KTi$_{0.85}$Nb$_{1.15}$O$_5$ | 1.20 | 16 | 1.43 |
| S34 | Ca, Ba | Nb, Ti, Zr | -- | 0.368 | 0.539 | 1.46 | 0.021 | 0.037 | 0.036 | 1.070 | 0.937 | 0.038 | 0.026 | -- | -- | K$_2$(Ti, Nb, Co, Zn)$_6$O$_{13}$ | 1.31 | 16 | 1.41 |
| S35 | Ca, Ba | Nb, Ti, Zr | Co, Zn | 0.435 | 0.487 | 1.12 | 0.022 | 0.021 | 0.035 | 1.010 | 0.945 | 0.021 | 0.025 | 0.005 | 0.005 | CoZnTiO$_4$ | 1.33 | 16 | 1.09 |
| S111(*) | -- | Nb | -- | 0.460 | 0.540 | 1.17 | 0.000 | -- | -- | 1.000 | 1.000 | -- | -- | -- | -- | -- | -- | 16 | 1.15 |
| S112(*) | -- | Nb | -- | 0.350 | 0.650 | 1.86 | 0.000 | -- | -- | 1.000 | 1.000 | -- | -- | -- | -- | -- | -- | 16 | 1.86 |

FIG. 8B

Effects of components of main phase and subphase (2)

| Sample | Composition | Subphase percentage (vol. %) | Occupancy percentage in firing sheath (vol. %) | Na/K ratio a/b (analyzed value) | Dielectric constant $\varepsilon_{33}^T/\varepsilon_0$ | Piezoelectric constant $d_{33}$ (pC/N) | Electromechanical coupling factor kr | Existence of twofold-period spots in electron beam diffraction image | Area ratio of crystal phase reflecting twofold-period spots in electron beam diffraction image in main phase (%) | Maximum grain size of crystal phase reflecting twofold-period spots in electron beam diffraction image (nm) |
|---|---|---|---|---|---|---|---|---|---|---|
| S31 (=S05) | | 1.51 | 16 | 1.40 | 2388 | 333 | 0.54 | Yes | 22.5 | 8.6 |
| S32 | FIG. 8A | 1.14 | 16 | 1.43 | 2402 | 328 | 0.53 | Yes | 22.8 | 4.3 |
| S33 | | 1.20 | 16 | 1.43 | 2085 | 292 | 0.50 | Yes | 24.5 | 5.3 |
| S34 | | 1.31 | 16 | 1.41 | 2263 | 295 | 0.50 | Yes | 24.2 | 6.6 |
| S35 | | 1.33 | 16 | 1.09 | 1975 | 311 | 0.54 | Yes | 3.3 | 3.2 |
| S111(*) | FIG. 8A | Undetectable | 16 | 1.15 | Not densified, unmeasurable | | | Yes | 5.1 | 3.5 |
| S112(*) | | Undetectable | 16 | 1.86 | Not densified, unmeasurable | | | Yes | 31.7 | 14.8 |

# LEAD-FREE PIEZOELECTRIC CERAMIC COMPOSITION, PIEZOELECTRIC ELEMENT USING THE SAME, AND METHOD OF MANUFACTURING LEAD-FREE PIEZOELECTRIC CERAMIC COMPOSITION

This application is a National Stage of International Application No. PCT/JP2015/001199 filed Mar. 5, 2015, claiming priority based on Japanese Patent Applications Nos. 2014-081771 filed Apr. 11, 2014 and 2014-248978 filed Dec. 9, 2014, the contents of all of which are incorporated herein by reference in their entirety.

TECHNICAL FIELD

The present invention relates to a lead-free piezoelectric ceramic composition to be used in a piezoelectric element or the like, to a piezoelectric element using the same, and to a method of manufacturing the same.

BACKGROUND ART

Many of conventionally mass-produced piezoelectric ceramics are formed of PZT (lead zirconate titanate) materials and thus contain lead. However, in recent years, in order to eliminate an adverse effect of lead on the environment, development of lead-free piezoelectric ceramics has been desired. A composition expressed by compositional formula $ANbO_3$ (A indicates an alkali metal), such as potassium sodium niobate ($(K, Na)NbO_3$), is proposed as material for such a lead-free piezoelectric ceramic (called "lead-free piezoelectric ceramic composition"). However, an $ANbO_3$ lead-free piezoelectric ceramic composition involves a problem in that sinterability and resistance to humidity are poor.

In order to cope with such a problem, Patent Document 1 mentioned below discloses a method of improving sinterability and, in turn, piezoelectric constant $d_{33}$ and electromechanical coupling factor kr by adding Cu, Li, Ta, or the like to an $ANbO_3$ lead-free piezoelectric ceramic composition.

Also, Patent Document 2 discloses a lead-free piezoelectric ceramic composition expressed by general formula $\{Li_x(K_{1-y}Na_y)_{1-x}\}(Nb_{1-z}Sb_z)O_3$ ($0 \le x \le 0.2$, $0 \le y \le 1.0$, $0 \le z \le 0.2$ except x=z=0) which exhibits relatively good sinterability and piezoelectric properties (piezoelectric constant $d_{33}$ and electromechanical coupling factor kr).

PRIOR ART DOCUMENTS

Patent Documents

Patent Document 1: Japanese Patent Application Laid-Open (kokai) No. 2000-313664
Patent Document 2: Japanese Patent Application Laid-Open (kokai) No. 2003-342069

SUMMARY OF THE INVENTION

Problem to be Solved by the Invention

However, the piezoelectric ceramic composition described in Patent Document 1 exhibits improved sinterability, but is inferior to a conventional leaded piezoelectric ceramic composition in piezoelectric constant $d_{33}$ and electromechanical coupling factor kr; therefore, the piezoelectric ceramic composition is of insufficient practical use. Meanwhile, the piezoelectric ceramic composition described in Patent Document 2 exhibits relatively high piezoelectric properties, but is inferior to a leaded piezoelectric ceramic composition in piezoelectric constant $d_{33}$ and electromechanical coupling factor kr; thus, the piezoelectric ceramic composition is insufficient for replacing a leaded piezoelectric ceramic composition. Thus, in order to put various types of devices using a lead-free piezoelectric ceramic composition into practical use, development of a lead-free piezoelectric ceramic composition having higher piezoelectric constant $d_{33}$ and electromechanical coupling factor kr is desired.

Means for Solving the Problem

The present invention has been conceived to solve the above problem and can be embodied in the following modes.
(1) A mode of the present invention provides a lead-free piezoelectric ceramic composition whose main phase is of an alkali niobate/tantalate perovskite oxide having piezoelectric properties and whose subphase is of a metal oxide different from the main phase. In this lead-free piezoelectric ceramic composition, the mole ratio (Na/K) between Na (sodium) and K (potassium) in the main phase falls within a range represented by 0.40<(Na/K)<3.0. The main phase has a crystal structure in which (i) first spots corresponding to a primitive lattice period and (ii) second spots corresponding to the lattice period two times the primitive lattice period and being weaker than the first spots appear in an electron beam diffraction image obtained through a transmission electron microscope on the condition that an electron beam enters from the <100> direction with the main phase represented as a pseudo-cubic crystal system. Also, the area ratio of a crystal phase reflecting the second spots in the main phase is 33% or less, and the maximum grain size of crystals reflecting the second spots in the main phase is 25 nm or less. According to this constitution, since the main phase has such a crystal structure as to exhibit effective values of piezoelectric constant $d_{33}$ and electromechanical coupling factor kr, and the density of a lead-free piezoelectric ceramic composition is sufficiently high, a lead-free piezoelectric ceramic composition that is excellent in piezoelectric constant $d_{33}$ and electromechanical coupling factor kr can be provided.
(2) In the above-mentioned lead-free piezoelectric ceramic composition, the subphase may fill pores formed between the main phases. According to this constitution, since the subphase fills pores formed between the main phases to thereby stabilize the structure of the main phase, a lead-free piezoelectric ceramic composition that is excellent in piezoelectric constant $d_{33}$ and electromechanical coupling factor kr can be provided.
(3) In the above-mentioned lead-free piezoelectric ceramic composition, the mole ratio (Na/K) may assume a value in a range represented by 1.0<(Na/K)<2.0. According to this constitution, a lead-free piezoelectric ceramic composition that is quite excellent in piezoelectric constant $d_{33}$ and electromechanical coupling factor kr can be provided.
(4) In the above-mentioned lead-free piezoelectric ceramic composition, Na (sodium) and K (potassium) contained in the main phase may account for 89 mol % or more of A-site atoms in the perovskite structure of the main phase. According to this constitution, since the main phase is stabilized, a lead-free piezoelectric ceramic composition that is quite excellent in piezoelectric constant $d_{33}$ and electromechanical coupling factor kr can be provided.

(5) In the above-mentioned lead-free piezoelectric ceramic composition, the alkali niobate/tantalate perovskite oxide may be an alkali niobate perovskite oxide. According to this constitution, as compared with the case where the alkali niobate/tantalate perovskite oxide is an alkali tantalate perovskite oxide, a lead-free piezoelectric ceramic composition having high Curie temperature (Tc) can be provided.

(6) Another mode of the present invention provides a piezoelectric element characterized by having a piezoelectric ceramic formed of the above-mentioned lead-free piezoelectric ceramic composition, and an electrode attached to the piezoelectric ceramic.

(7) A further mode of the present invention provides a method of manufacturing the above-mentioned lead-free piezoelectric ceramic composition. This method is characterized by including a compacting step of forming an unsintered green compact of the above-mentioned lead-free piezoelectric ceramic composition and a closed firing step of firing the green compact contained in a closed container, and characterized in that, in the closed firing step, the occupancy percentage of the volume of the green compact to the capacity of the closed container is 1% to 30%. This method can easily manufacture the above-mentioned lead-free piezoelectric ceramic composition.

The present invention can be embodied in various forms. For example, the invention can be embodied in a lead-free piezoelectric ceramic composition, a piezoelectric element using the lead-free piezoelectric ceramic composition, various types of devices equipped with the piezoelectric element (knock sensors, cutting tools, ultrasonic sensors, actuators, etc.), and a method of manufacturing a lead-free piezoelectric ceramic composition.

BRIEF DESCRIPTION OF THE DRAWINGS

FIG. 4A Table showing experimental results regarding the effects of the Na/K ratio on piezoelectric constant $d_{33}$ and electromechanical coupling factor kr.

FIG. 4B Table showing experimental results regarding the effects of the Na/K ratio on piezoelectric constant $d_{33}$ and electromechanical coupling factor kr.

FIG. 4C Table showing experimental results regarding the effects of the Na/K ratio on piezoelectric constant $d_{33}$ and electromechanical coupling factor kr.

FIG. 4D Transmission electron microscope images obtained by performing Fourier transformation and inverse Fourier transformation on the main phases of samples.

FIG. 4E Explanatory table showing electron beam incident orientations employed in a transmission electron microscope.

FIG. 4F Table showing the results of an experiment regarding the influence of firing temperature.

FIG. 6 Views showing electron beam diffraction images of samples.

FIG. 7 Schematic views showing a perovskite structure of the main phase.

FIG. 8A Table showing experimental results regarding effects of components of the subphase and the main phase on piezoelectric constant $d_{33}$ and electromechanical coupling factor kr.

FIG. 8B Table showing experimental results regarding effects of components of the subphase and the main phase on piezoelectric constant $d_{33}$ and electromechanical coupling factor kr.

MODES FOR CARRYING OUT THE INVENTION

Figure 1:
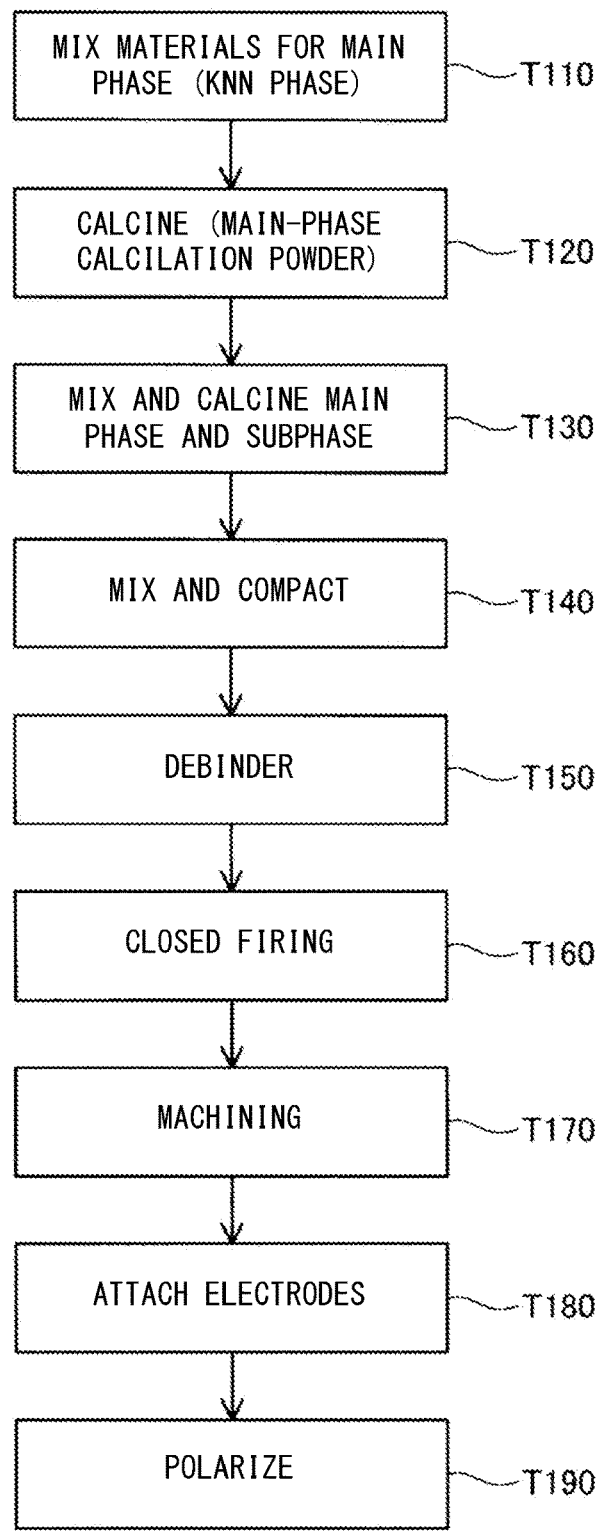
FIG. 1 Flowchart showing a method of manufacturing a piezoelectric element according to an embodiment of the present invention.

A piezoelectric ceramic composition according to an embodiment of the present invention is a lead-free piezoelectric ceramic composition which includes at least a main phase (first crystal phase) formed of an alkali niobate/tantalate perovskite oxide having piezoelectric properties and may include a subphase (second crystal phase, etc.), which is a crystal phase other than the main phase. Through mixed existence with the main phase, the subphase stabilizes the structure of the main phase, thereby improving piezoelectric constant $d_{33}$ and electromechanical coupling factor kr. Specifically, the subphase has a function of stabilizing the structure of the main phase by filling pores of the main phases. Notably, the subphase may include a crystal phase (third crystal phase, etc.) other than the second crystal phase.

<Preferred composition of main phase> Preferably, a perovskite oxide which forms the main phase includes at least one of an alkali niobate perovskite oxide and an alkali tantalate perovskite oxide. The term "alkali niobate/tantalate perovskite oxide" collectively refers to those perovskite oxides. The alkali components of an alkali niobate/tantalate perovskite oxide include at least an alkali metal (K (potassium), Na (sodium), Li (lithium), Rb (rubidium), etc.) and may include an alkaline earth metal (Ca (calcium), Sr (strontium), Ba (barium), etc.). Preferably, such an alkali niobate/tantalate perovskite oxide is expressed by the following compositional formula.

$$(K_aNa_bLi_cC_d)_e(D_fE_g)O_h \quad (1)$$

where element C is one or more of Ca (calcium), Sr (strontium), Ba (barium), and Rb (rubidium); element D is one or more, including at least Nb or Ta, of Nb (niobium), Ta (tantalum), Ti (titanium), and Zr (zirconium); element E is one or more of Mg (magnesium), Al (aluminum), Sc (scandium), Mn (manganese), Fe (iron), Co (cobalt), Ni (nickel), Zn (zinc), Ga (gallium), and Y (yttrium); a+b+c+d=1; e is an arbitrary value; f+g=1; and h is an arbitrary value for forming the perovskite structure.

In compositional formula (1) mentioned above, in the case where elements C and E may include one or two types of elements, and element D may include one to three types of elements, compositional formula (1) can be rewritten to the following compositional formula (1a).

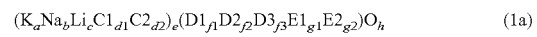

$$(K_aNa_bLi_cC1_{d1}C2_{d2})_e(D1_{f1}D2_{f2}D3_{f3}E1_{g1}E2_{g2})O_h \quad (1a)$$

where a+b+c+d1+d2=1; e is an arbitrary value; f1+f2+f3+g1+g2=1; and h is an arbitrary value for forming the perovskite structure. This compositional formula (1a) is equivalent to the above compositional formula (1). As is understood from this example, in the case where element C includes two types of metal elements, the value of factor d of element C is represented by the sum of factors d1 and d2 of two types of elements C1 and C2. The same also applies to elements D and E.

In compositional formula (1) mentioned above, K (potassium), Na (sodium), Li (lithium), and element C (Ca, Sr, Ba, Rb) are disposed at the so-called A site of the perovskite structure. Also, element D (one or more, including at least Nb or Ta, of Nb, Ta, Ti, and Zr) and element E (one or more of Mg, Al, Sc, Mn, Fe, Co, Ni, Zn, Ga, and Y) are disposed at the so-called B site. Regarding factors a, b, c, and d of elements at the A site, the sum (a+b+c) of the first three factors is preferably not zero; however, factor d may be zero. Of factors f and g of elements D and E, respectively, at the B site, factor f of element D is preferably not zero; however, factor g of element E may be zero. That is, preferably, the alkali niobate/tantalate perovskite oxide of the present embodiment contains at least one or more types of alkali metals (K, Na, Li, Rb) at the A site and may contain an alkali earth metal (Ca, Sr, Ba) at the A site, and also contains one or more, including at least Nb or Ta, of Nb, Ta, Ti, and Zr at the B site and may contain one or more types of other metals (Mg, Al, Sc, Mn, Fe, Co, Ni, Zn, Ga, Y) at the B site. Particularly preferably, Na (sodium) and K (potassium) account for 89 mol % or more of A-site atoms of the main phase, since quite excellent piezoelectric constant $d_{33}$ and electromechanical coupling factor kr are provided. Most preferably, constituent elements of the B site include Nb. An alkali niobate perovskite oxide which contains Nb is preferred over an alkali tantalate perovskite oxide which does not contain Nb, since it can provide a lead-free piezoelectric ceramic composition having a higher Curie temperature (Tc). This can be analogized from test results shown in FIG. 6 of International Publication No. WO2011/093021 disclosed by the applicant of the present invention.

Among those values of factors a, b, c, d, e, f, g, and h in the above-mentioned compositional formula (1) which allow establishment of a perovskite structure, preferable ones in view of piezoelectric constant $d_{33}$ and electromechanical coupling factor kr of a lead-free piezoelectric ceramic composition can be selected. Specifically, preferably, factors a, b, and c assume a value of 0 to less than 1, and a=b=c=0 (i.e., piezoelectric ceramic composition which contains none of K, Na, and Li) does not hold true. Factors a and b of K and Na, respectively, typically assume values in respective ranges represented by 0<a≤0.6 and 0<b≤0.6. Factor c of Li may assume a value of zero, but preferably assumes a value in a range represented by 0<c≤0.2, more preferably 0<c≤0.1. Factor d of element C (one or more of Ca, Sr, Ba) may assume a value of zero, but preferably assumes a value in a range represented by 0<d≤0.2, more preferably 0<d≤0.1. Factor e of the entire A site assumes an arbitrary value, preferably a value in a range represented by 0.80≤e≤1.10, more preferably a value in a range represented by 0.84≤e≤1.08, most preferably 0.88≤e≤1.07. Factor h of oxygen may assume such an arbitrary value that the main phase is of a perovskite oxide. Factor h assumes a typical value of about 3, preferably a value in a range represented by 2.9≤h≤3.1. Notably, the value of factor h can be calculated from an electrical neutrality condition of the composition of the main phase. However, the composition of the main phase is allowed to slightly deviate from the electrical neutrality condition.

The main phase has a typical composition of (K, Na, Li, Ca, Ba)$_e$(Nb, Ti, Zr)O$_h$ and contains K, Na, and Nb as main metal components. Since the main phase contains K, Na, and Nb as main metal components, a material formed of the main phase is also called "KNN" or "KNN material," and the main phase is also called "KNN phase." Through employment of the KNN phase as the main phase, a lead-free piezoelectric ceramic composition having excellent piezoelectric properties can be provided.

<Preferred composition of subphase> A lead-free piezoelectric ceramic composition according to an embodiment of the present invention may contain a metal oxide different from the main phase as the subphase. Preferably, the subphase contains, for example, one or more types of metal oxides selected from following (a) to (e).
(a) Monometal oxide of a metal element selected from Mg (magnesium), Ni (nickel), Co (cobalt), Fe (iron), Mn (manganese), Cr (chromium), Zr (zirconium), Ti (titanium), Ag (silver), Zn (zinc), Sc (scandium), and B (bismuth);
(b) M-Ti—O spinel compound (element M is monovalent to pentavalent metal);
(c) $A_2B_6O_{13}$ compound (element A is monovalent metal; element B is bivalent to hexavalent metal);
(d) $A_3B_5O_{15}$ compound (element A is monovalent or bivalent metal; element B is bivalent to pentavalent metal); and
(e) A-Ti—B—O compound (element A is an alkali metal; element B is at least one of Nb and Ta).

The subphase which contains such a compound(s) does not have piezoelectric properties in itself and has a function of improving sinterability and density through mixed existence with the main phase. Addition of such a subphase can yield a lead-free piezoelectric ceramic composition having excellent piezoelectric constant $d_{33}$ and electromechanical coupling factor kr. The total content of components of the subphase is preferably 5 vol. % or less the entire lead-free piezoelectric ceramic composition, more preferably 2 vol. % or less. A total content of components of the subphase in excess of 5 vol. % may possibly cause deterioration in piezoelectric constant $d_{33}$ and electromechanical coupling factor kr.

Applicable monometal oxides are, for example, MgO, NiO, $Co_3O_4$, $Fe_2O_3$, $MnO_2$, $Cr_2O_3$, $ZrO_2$, $TiO_2$, $Ag_2O$, ZnO, $Sc_2O_3$, and $Bi_2O_3$. Among these oxides, one, two, or three of $Co_3O_4$, ZnO, and $Fe_2O_3$ are preferred for use as the subphase, since the structure of the main phase can be stabilized.

The composition of M-Ti—O spinel compound can be expressed by the following formula (2).

$$M_xTiO_y \qquad (2)$$

where element M is monovalent to pentavalent metal; specifically, at least one of Li (lithium), Na (sodium), K (potassium), Mg (magnesium), Al (aluminum), Sc (scandium), Cr (chromium), Mn (manganese), Fe (iron), Co (cobalt), Ni (nickel), Zn (zinc), Ga (gallium), Y (yttrium), Zr (zirconium), Sn (tin), Sb (antimony), Nb (niobium), Ta (tantalum), Si (silicon), and Hf (hafnium). Notably, in the case where Li is contained as element M, in order to form a spinel compound, preferably, one or more of the above-mentioned metal elements other than Li are contained together with Li. Factors x and y are relative values in relation to a content of Ti of 1. In order to form a spinel compound, factor x preferably assumes a value in a range represented by 0.5≤x≤8.0, more preferably 0.5≤x≤5.0. Also, factor y assumes an arbitrary value for forming a spinel compound, but preferably assumes a typical value in a range represented by 2≤y≤8. Specific examples of a preferred spinel compound are NiFeTiO$_4$, MgFeTiO$_4$, Ni$_2$(Ti, Zr)O$_4$, Ni$_2$(Ti, Hf)O$_4$, Ni$_{1.5}$FeTi$_{0.5}$O$_4$, CoMgTiO$_4$, CoFeTiO$_4$, (Fe, Zn, Co)$_2$TiO$_4$, and CoZnTiO$_4$. Since a spinel compound stabilizes the structure of the main phase, a piezoelectric ceramic composition having excellent piezoelectric constant d$_{33}$ and electromechanical coupling factor kr can be provided.

A spinel compound may be a normal spinel compound or an inverse spinel compound. Whether or not a compound is a spinel compound can be judged by performing Rietveld Analysis which uses a powder X-ray diffraction (XRD) pattern.

An applicable A$_2$B$_6$O$_{13}$ compound is such that element A (monovalent metal) is at least one of Li, Na, and K, and element B (bivalent to hexavalent metal) is at least one of Co, Fe, Mg, Ni, Zr, Mn, Al, Nb, Ta, and W. Specific examples of such an applicable compound include K$_2$(Ti, Nb, Mg)$_6$O$_{13}$ and K$_2$(Ti, Nb, Co, Zn)$_6$O$_{13}$.

An applicable A$_3$B$_5$O$_{15}$ compound is such that element A (monovalent or bivalent metal) is at least one of Ba, Ca, Sr, Na, K, and Li, and element B (bivalent to pentavalent metal) is at least one of Nb, Mn, Fe, Ni, Co, Zn, and Zr. Specific examples of such an applicable compound include (Ba, Na, K)$_3$(Nb, Ni, Fe)$_5$O$_{15}$, (Ba, Na, K)$_3$(Nb, Co, Ni)$_5$O$_{1.5}$, (Ba, Na, K)$_3$(Nb, Zn)$_5$O$_{15}$, (Ba, Na, K)$_3$(Nb, Mn)$_5$O$_{15}$, and (Ba, Na, K)$_3$(Nb, Fe, Zn, Co)$_5$O$_{15}$.

An applicable A-Ti—B—O compound has a composition expressed by the following formula (3) or (4).

$$A_{1-x}Ti_{1-x}B_{1+x}O_5 \quad (3)$$

$$A_1Ti_3B_1O_9 \quad (4)$$

where element A is at least one type of alkali metal (K (potassium), Rb (rubidium), Cs (cesium), etc.), and element B is at least one of Nb (niobium) and Ta (tantalum). Factor x in the above-mentioned formula (3) assumes an arbitrary value. However, preferably, factor x assumes a value in a range represented by 0≤x≤0.15. By means of factor x assuming a value in this range, the structure of a compound is stabilized; thus, a uniform crystal phase can be provided.

Specific applicable compounds according to the above-mentioned formula (3) are KTiNbO$_5$, K$_{0.90}$Ti$_{0.90}$Nb$_{1.10}$O$_5$, K$_{0.85}$Ti$_{0.85}$Nb$_{1.15}$O$_5$, RbTiNbO$_5$, Rb$_{0.90}$Ti$_{0.90}$Nb$_{1.10}$O$_5$, Rb$_{0.85}$Ti$_{0.85}$Nb$_{1.15}$O$_5$, CsTiNbO$_5$, Cs$_{0.90}$Ti$_{0.90}$Nb$_{1.10}$O$_5$, KTiTaO$_5$, and CsTiTaO$_5$. Notably, in view of structural stability of this compound, in the case of element A being K (potassium) or Rb (rubidium), factor x preferably assumes a value in a range represented by 0≤x≤0.15, and in the case of element A being Cs (cesium), factor x preferably assumes a value in a range represented by 0≤x≤0.10. Selecting K (potassium) as element A, and Nb (niobium) as element B can provide a piezoelectric ceramic composition that is excellent in piezoelectric constant d$_{33}$ and electromechanical coupling factor kr.

Crystal phases expressed by formulas (3) and (4) are both complex oxides of element A (alkali metal), Ti (titanium), and element B (at least one of Nb and Ta). A complex oxide of element A, Ti (titanium), and element B is called "A-Ti—B—O complex oxide." An A-Ti—B—O complex oxide (element A is an alkali metal; element B is at least one of Nb and Ta; and the contents of element A, element B, and Ti are not zero) can be applied.

FIG. 1 is a flowchart showing a method of manufacturing a piezoelectric element according to an embodiment of the present invention. In step T110, materials for the main phase are selected from K$_2$CO$_3$ powder, Na$_2$CO$_3$ powder, Li$_2$CO$_3$ powder, Rb$_2$CO$_3$ powder, CaCO$_3$ powder, SrCO$_3$ powder, BaCO$_3$ powder, Nb$_2$O$_5$ powder, Ta$_2$O$_5$ powder, TiO$_2$ powder, ZrO$_2$ powder, MgO powder, Al$_2$O$_3$ powder, Sc$_2$O$_3$ powder, MnO$_2$ powder, Fe$_2$O$_3$ powder, Co$_3$O$_4$ powder, NiO powder, ZnO powder, Ga$_2$O$_3$ powder, Y$_2$O$_3$ powder, etc., and the selected materials are measured out according to values of factors a, b, c, d, e, f, and g in the compositional formula of the main phase. Ethanol is added to these material powders. The resultant mixture is wet-mixed in a ball mill preferably for 15 hours or more, thereby yielding slurry. In step T120, mixed powder obtained by drying the slurry is calcined, for example, at a temperature of 600° C. to 1,100° C. in the atmosphere for one to 10 hours, thereby yielding main-phase calcination powder.

In step T130, oxide powders used to form the subphase are measured out and mixed with the main-phase calcination powder. To the resultant mixture in a ball mill, dispersant, binder, and ethanol are added, followed by pulverization and mixing to thereby form slurry. Mixed powder obtained by drying the slurry is calcined, for example, at a temperature of 600° C. to 1,100° C. in the atmosphere for one to 10 hours, thereby yielding calcination powder. In step T140, dispersant, binder, and ethanol are again added to the calcination powder obtained in step T130. The resultant mixture is pulverized and mixed, thereby yielding slurry. The slurry is dried in a spray drier for granulation. The resultant granular substance is compacted to a desired shape, for example, by uniaxial pressing at a pressure of 20 MPa. Typical shapes of a piezoelectric ceramic compatible with various types of apparatus for use in the method according to the embodiment of the present invention are of a disk, a circular column, and a quadrangular flat plate. Subsequently, the CIP (cold isostatic pressing) process is performed at a pressure of, for example, 150 Mpa, thereby yielding a green compact. In step T150, a debindering step is performed for debindering the yielded green compact, for example, by holding the green compact at a temperature of 500° C. to 800° C. in the atmosphere for two to 10 hours.

In step T160, the debindered green compact is held, for firing, at a predetermined temperature (e.g., 1,150° C.) selected from a temperature range of, for example, 1,000° C. to 1,300° C. in the atmosphere for two to 50 hours, thereby yielding a piezoelectric ceramic. Preferably, in step T160, closed firing is performed; specifically, the green compact contained in a closed container is fired. The reason for this is to prevent outward dissipation of metal elements, such as an alkali metal (Li, Na, K), contained in the green compact. An applicable such a closed container is, for example, aluminum sheath A-1174, a product of Otake Ceram.

Figure 2:
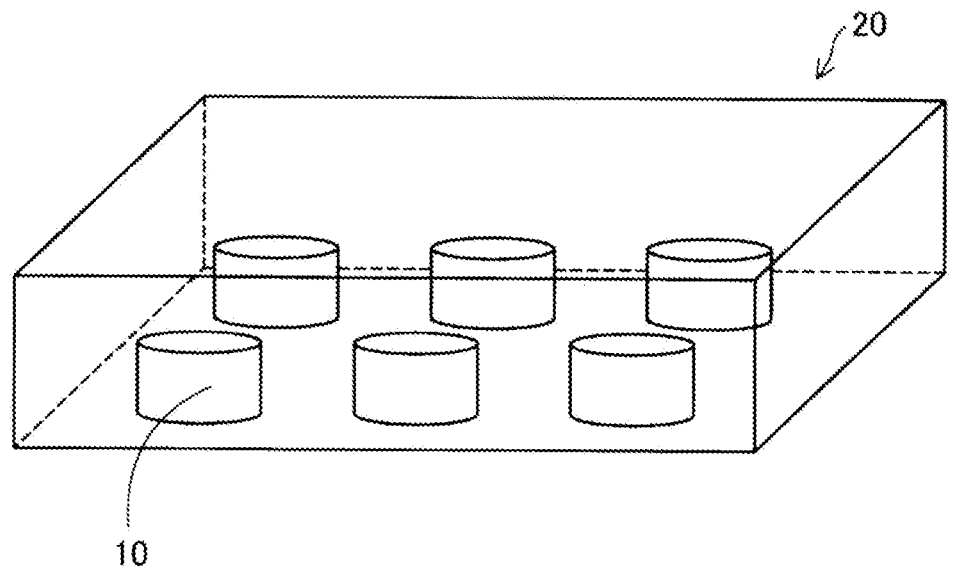
FIG. 2 Schematic view showing a state in which green compacts are contained in a firing sheath, which serves as a closed container.

FIG. 2 is a schematic view showing a state in which the green compacts are contained in a firing sheath, which serves as a closed container. In this example, a plurality of green compacts 10 are contained in a firing sheath 20 having a substantially rectangular parallelepiped shape. The unsintered green compacts 10 account for preferably 1 vol. % to 30 vol. %, more preferably 1 vol. % to 20 vol. %, most preferably 5 vol. % to 20 vol. % of the capacity of the firing sheath 20. Through employment of such an occupancy percentage, an alkali metal contained in the unsintered green compacts 10 moves appropriately during sintering, whereby density, piezoelectric constant d$_{33}$, and electromechanical coupling factor kr of sintered bodies can be improved.

In step T170 of FIG. 1, a piezoelectric ceramic is machined according to dimensional accuracy required of a piezoelectric element. In step T180, to the thus-yielded piezoelectric ceramic, electrodes are attached. In step T190, polarization is performed.

Figure 3:
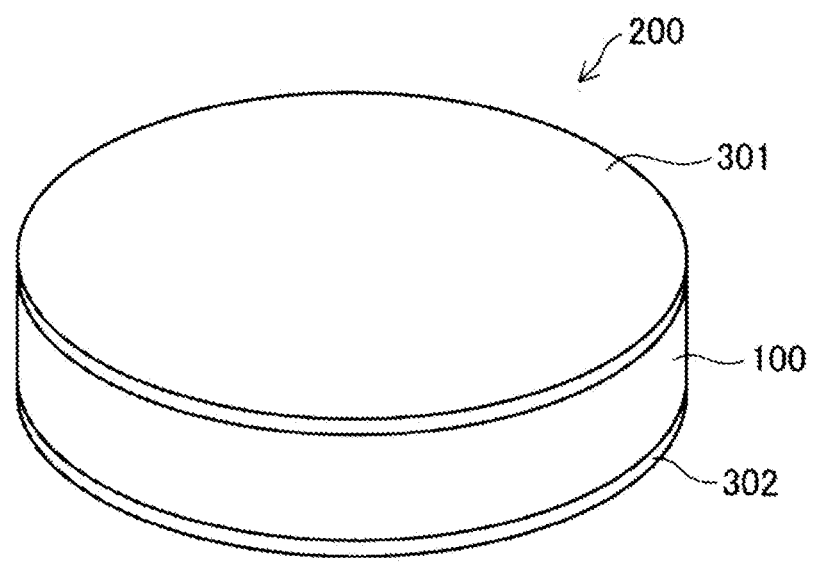
FIG. 3 Perspective view showing a piezoelectric element according to an embodiment of the present invention.

FIG. 3 is a perspective view showing a piezoelectric element according to an embodiment of the present invention. This piezoelectric element 200 is configured such that electrodes 301 and 302 are attached to the upper and lower surfaces, respectively, of a disk-like piezoelectric ceramic 100. Notably, the piezoelectric element can have various shapes and structures other than those mentioned above.

The piezoelectric ceramic composition and the piezoelectric element according to embodiments of the present invention can be widely applied to detection of vibration, detection of pressure, oscillation, piezoelectric devices, etc. For example, they can be utilized in various types of apparatus, such as sensors for detecting various types of vibrations (knocking sensors, combustion pressure sensors, etc.), actuators, high-voltage transformers, various types of driving units, position control units, vibration suppression apparatus, and fluid ejectors (paint ejection, fuel ejection, etc.). The piezoelectric ceramic composition and the piezoelectric element according to embodiments of the present invention are particularly preferred for those applications which require excellent thermal durability (e.g., knocking sensors and combustion pressure sensors).

EXAMPLES

FIGS. 4A to 4C are tables showing experimental results regarding the effects of the atomic ratio between Na and K (called "Na/K ratio") in the main phase on piezoelectric constant $d_{33}$ and electromechanical coupling factor kr with respect to a plurality of sample compositions including sample compositions of an example of the present invention. FIGS. 4A and 4B show components of the main phase and components of the subphase at the time of mixing materials, the occupancy percentage (vol. %) of green compacts contained in a firing sheath, the subphase percentage (vol. %) of a piezoelectric ceramic composition after firing, and an analyzed value of the Na/K ratio with respect to samples S01 to S22 of the example and samples S101 to S106 of a comparative example. Factors a to g of elements C to E, respectively, of the main phase are those appearing in the above-mentioned formula (1a). Notably, in FIG. 4B, the samples whose sample numbers are marked with (*) are of the comparative example.

Sintered bodies of the samples were manufactured according to the above-mentioned steps T110 to T160 in FIG. 1. Green compacts formed in step T140 had a disk-like shape (diameter 20 mm, thickness 2 mm). The thus-obtained sintered bodies of the samples were measured for subphase percentage (vol. %). Also, by use of a transmission electron microscope, the Na/K ratio was measured, and electron beam diffraction images were captured.

<Measurement of subphase percentage (vol. %)> The subphase percentage (vol. %) shown in FIGS. 4A and 4B were measured as follows. First, sintered bodies of the samples were mirror-polished and subjected to electroconductive treatment; then, backscattered electron images were captured with respect to the samples at a magnification of 1,000 by means of an electron probe microanalyzer (EPMA). A backscattered electron image was captured at 10 points on one sample. The thus-captured backscattered electron images were represented in 8-gradation, and each backscattered electron image was separated, according to gradations, to three regions; specifically, the main phase, the subphase, and pores. Subsequently, by use of image analysis software, the area percentage of the subphase was measured. An average area percentage of the subphase of eight images remaining after elimination of an image having the greatest area percentage of the subphase and an image having the smallest area percentage of the subphase was employed as the area percentage of the subphase of the sample. The thus-obtained area percentage of the subphase was used as the volume percentage of the subphase (subphase percentage). Image processing software used in the present embodiment was WinROOF, a product of Mitani Corporation.

<Measurement of Na/K ratio and method of capturing electron beam diffraction images> Measurement of Na/K ratio and capturing of electron beam diffraction images were performed by use of a transmission electron microscope (TEM) having an energy dispersive X-ray spectrometer (EDS) and an electron beam diffraction measuring device (EM-002B, a product of TOPCON Corporation). TEM assay samples for use in such analysis were prepared as follows: the sintered bodies were cut into disks having a diameter of 3.0 mm, and the disks were mechanically polished to a film thickness of about 50 μm. Subsequently, in order to thin the disks to a thickness of about 10 μm as measured at the center, Ar +ions accelerated at an acceleration voltage of 2 keV to 4 keV were injected at an incident angle of 4°, thereby preparing flake samples. Electron beam diffraction images were observed at an acceleration voltage of 200 kV. Furthermore, the obtained electron beam diffraction images were tone-corrected; specifically, contrast, brightness, gamma correction, and chroma of the obtained electron beam diffraction images were adjusted as appropriate by use of functions of the apparatus so as to clarify spots.

Processing steps T170 to T190 in FIG. 1 were performed on the sintered bodies of samples S01 to S22 and S101 to S106, thereby forming respective piezoelectric elements 200 (FIG. 3). On this occasion, before firing in step T160, the occupancy percentage (vol. %) of the unsintered green compacts 10 to the capacity of the firing sheath 20 was measured. Also, by use of the piezoelectric elements 200 of the samples, properties (dielectric constant $\varepsilon_{33}^{T}/\varepsilon_0$, piezoelectric constant $d_{33}$, and electromechanical coupling factor kr) of the piezoelectric ceramics 100 were measured.

As shown in FIGS. 4A and 4B, samples S01 to S22 and S101 to S106 have the common feature that the main phase is the KNN phase expressed by $(K, Na, Li, Ca, Ba)_e(Nb, Ti, Zr)O_h$, and the subphase is formed of three types of monometal oxides of $Co_3O_4$, ZnO, and $Fe_2O_3$. However, the samples slightly differ in the composition (the values of factors of elements) of the main phase. The values of factors a to g shown in the composition column of the main phase are those in mixing powder materials in step T110 of FIG. 1, and FIGS. 4A and 4B also show the Na/K ratio (=b/a) in mixing the materials. Meanwhile, the analyzed values of the Na/K ratio shown at the right end of FIGS. 4A and 4B are those obtained by conducting EDS analysis on the sintered bodies. There is a slight difference between the values of the Na/K ratio in mixing the materials and the analyzed values of the Na/K ratio of the sintered bodies conceivably for the following reason: Na and K move or volatilize in the closed firing process in step T160 of FIG. 1. Notably, samples S01 to S22 of the example also have the common feature that Na (sodium) and K (potassium) account for 89 mol. % or more of A-site atoms of the main phase.

FIG. 4C shows the results of various types of measurements with respect to samples S01 to S22 and S101 to S106 of FIGS. 4A and 4B. Samples S01 to S22 of the example are preferable because of their sufficiently good property values; specifically, a dielectric constant $\varepsilon_{33}^{T}/\varepsilon_0$ of 1,900 or more, a piezoelectric constant $d_{33}$ of 280 pC/N or more, and an electromechanical coupling factor kr of 0.50 or more.

Since samples S102 and S103 of the comparative example were not densified, their property values failed to be measured. The reason that sample S102 failed to be densified is presumably that the main phase does not contain Na (Na/K ratio is zero). Also, part of the reason that sample S103 failed to be densified is presumably that the occupancy percentage of the green compacts 10 contained in the firing sheath 20 assumes a very low value of 0.5 vol. %. However, even at a very low occupancy percentage of the green compacts 10 contained in the firing sheath 20 of about 0.5 vol. %, sintered bodies may be sufficiently densified depending on the compositions of the main phase and the subphase. Samples S101, S104, S105, and S106 are densified, but are unpreferable, since their values of piezoelectric constant $d_{33}$ and electromechanical coupling factor kr are low.

Notably, spots corresponding to the lattice period two times the primitive lattice period appeared in electron beam diffraction images of samples S01 to S22 of the example. By contrast, spots corresponding to the lattice period two times the primitive lattice period failed to appear in electron beam diffraction images of samples S101 to S105 of the comparative example. Spots corresponding to the lattice period two times the primitive lattice period appeared in an electron beam diffraction image of sample S106. This issue will be further described herein later.

Figure 5A:
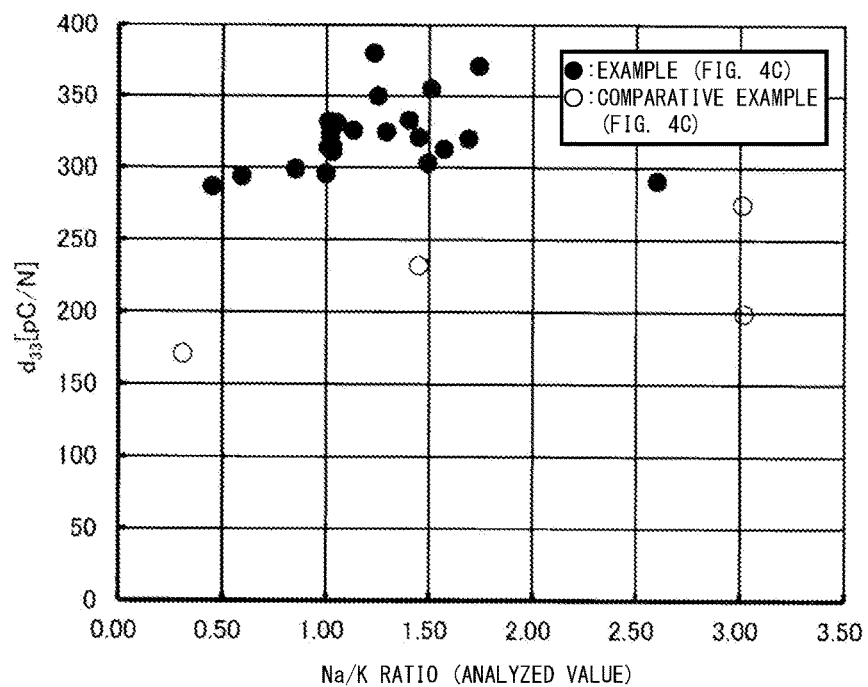
FIG. 5A Graph showing the relation between the Na/K ratio and piezoelectric constant $d_{33}$.
Figure 5B:
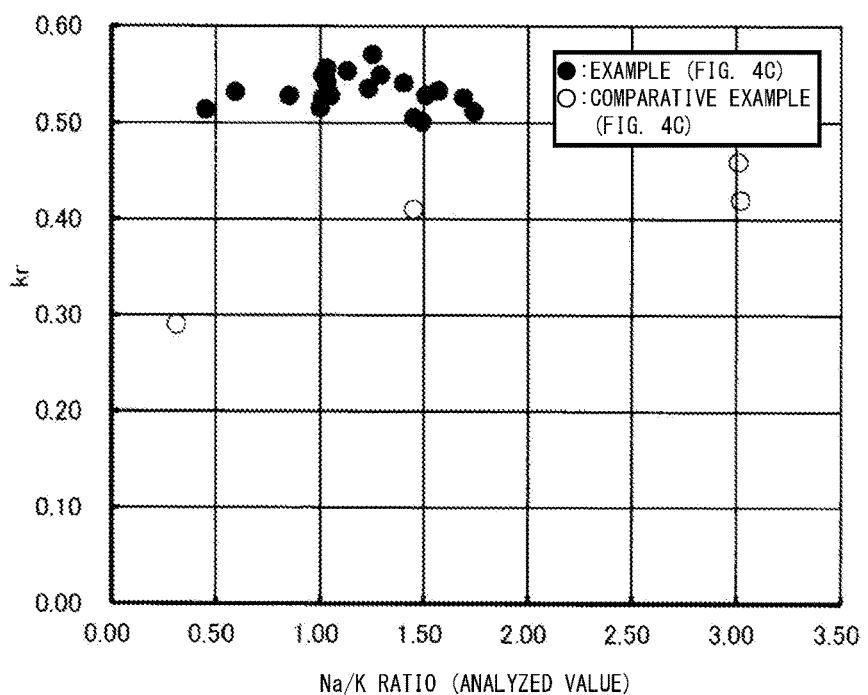
FIG. 5B Graph showing the relation between the Na/K ratio and electromechanical coupling factor kr.

FIG. 5A is a graph showing the relation between the Na/K ratio and piezoelectric constant $d_{33}$ with respect to the samples shown in FIG. 4C. FIG. 5B is a graph showing the relation between the analyzed value of the Na/K ratio and electromechanical coupling factor kr. In view of piezoelectric constant $d_{33}$ and electromechanical coupling factor kr, the Na/K ratio preferably assumes a value in a range represented by 0.40<(Na/K)<3.0, more preferably 1.0<(Na/K)<2.0. Sample S104 of the comparative example has an analyzed value of the Na/K of 1.45, which falls within a preferred range of the Na/K; however, presumably, since the structure of sample S104 is such that spots corresponding to the lattice period two times the primitive lattice period do not appear in its electron beam diffraction image, sample S104 exhibited rather poor property values of piezoelectric constant $d_{33}$ and electromechanical coupling factor kr.

FIG. 6 is a set of views showing electron beam diffraction images of samples. FIG. 6(A) shows an electron beam diffraction image of sample S104 of the comparative example, and FIG. 6(B) shows an electron beam diffraction image of sample S05 of the example. These electron beam diffraction images were obtained by injecting an electron beam from the <100> direction with the main phase represented as the pseudo-cubic crystal system. In the electron beam diffraction image of sample S102 shown in FIG. 6(A), only intensive spots corresponding to the primitive lattice period in the <100> direction of the main phase appears cyclically. By contrast, in the electron beam diffraction image of sample S05 shown in FIG. 6(B), in addition to intensive spots (first spots) corresponding to the primitive lattice period in the <100> direction of the main phase, weak spots (second spots) corresponding to the lattice period two times the primitive lattice period appears. The arrows of FIG. 6(B) are drawn for convenience of indicating weak spots. Presumably, such a difference between the electron beam diffraction images stems from the following difference in the crystal structure of the main phase.

FIGS. 7(A) and 7(B) are schematic views showing a perovskite structure of the main phase. The drawings show A-site atoms (Na, K, etc.), B-site atoms (Nb, Ta, etc.), and oxygen atoms in a perovskite oxide. B-site atoms (Na, Ta, etc.) and oxygen atoms constitute an oxygen octahedron. In the structure of FIG. 7(A), oxygen octahedrons are not tilted, and all oxygen octahedrons are oriented in the same direction. By contrast, in the structure of FIG. 7(B), oxygen octahedrons are tilted, and an oxygen octahedron having a different tilt angle exists every lattice period. Presumably, the above-mentioned intensive spots appearing in the electron beam diffraction image of FIG. 6(A) correspond to a lattice period (primitive lattice period) of a pseudo-cubic crystal system composed of untilted oxygen octahedrons as shown in FIG. 7(A). Meanwhile, presumably, the weak spots appearing in the electron beam diffraction image of FIG. 6(B) correspond to a lattice period appearing in a pseudo-cubic crystal system composed of tilted oxygen octahedrons as shown in FIG. 7(B); i.e., corresponds to two times the primitive lattice period.

As shown in FIG. 4(C), the electron beam diffraction images of samples S01 to S22 of the example contain, as shown in FIG. 6(B), intensive spots (first spots) corresponding to the primitive lattice period and weak spots (second spots) corresponding to the lattice period two times the primitive lattice period. By contrast, the electron beam diffraction images of samples S101 to S105 of the comparative example do not contain, as shown in FIG. 6(A), weak spots (second spots) corresponding to the lattice period two times the primitive lattice period.

Presumably, the reason that samples S101 to S105 of the comparative example are inferior to samples S01 to S22 of the example in piezoelectric constant $d_{33}$ and electromechanical coupling factor kr is due to such a crystal structure of the main phase. Particularly, sample S104 of the comparative example is low in piezoelectric constant $d_{33}$ and electromechanical coupling factor kr in spite of an analyzed value of the Na/K ratio of 1.45 and is thus inferior to the samples of the example. In view of this, preferably, a lead-free piezoelectric ceramic composition has a crystal structure such that the main phase assumes an Na/K ratio in a range represented by 0.40<(Na/K)<3.0, and intensive spots (first spots) corresponding to the primitive lattice period and weak spots (second spots) corresponding to a lattice period two times the primitive lattice period appear in an electron beam diffraction image obtained by beam injection from the <100> direction of the main phase.

Two columns at the right end of FIG. 4C show the area ratio of the crystal phase which reflects the weak spots (second spots) corresponding to the lattice period two times the primitive lattice period, and the maximum grain size of the crystals thereof. These values were calculated as follows.

<Method of measuring the area ratio of the crystal phase reflecting the second spots and the maximum grain size> As described in <Measurement of Na/K ratio and method of capturing electron beam diffraction images>, an electron beam diffraction image of the main phase was obtained by injecting an electron beam from the <100> direction with the main phase represented as the pseudo-cubic crystal system. This electron beam diffraction image is an image of a region which includes the main phase only and does not include phases (for example, subphase) other than the main phase. The second spots were extracted by applying the fast Fourier transformation (FFT) method to this electron beam diffraction image, whereby a crystal phase region reflecting the second spots was specified. Specifically, the procedure included a step of performing fast Fourier transformation on the electron beam diffraction image and a step of performing inverse Fourier transformation with diffraction spots of the second spots masked.

FIG. 4D shows electron beam diffraction images obtained by performing the inverse Fourier transformation in accordance with the above-described procedure. FIG. 4D shows the images of three samples S02, S03, and S106. Black dots correspond to the crystal phase reflecting the first spots, and white dots correspond to the crystal phase reflecting the second spots. Since an electron beam diffraction image is displayed as an aggregate of dots, image analysis was carried out by Image J (ver. 1.451) which is an open-source image software, whereby the area ratio and the maximum grain length were calculated. First, maximum value blurring (radius: 4.0 pixels) and Gaussian blurring (sigma: 5.0) were performed on each dot of the electron beam diffraction image obtained by the above-described method, whereby dots were connected. Subsequently, a threshold for binarization was determined by the Huang method, and binarization was performed such that the crystal phase region reflecting the first spots was white-colored and the crystal phase region reflecting the second spots was black-colored, whereby the two regions were made clear. Further, grain analysis was performed on the binarized image, whereby the area ratio was calculated. Also, the maximum length of each crystal phase region in the binarized image was measured as the maximum grain size. Notably, the fast Fourier transformation method was described in, for example, D. B. Williams, C. B. Carter, in: Transmission Electron Microscopy: a Textbook for Materials Science Imaging, Plenum Press, New York, 1996, P. 499. Also, the Huang method was described in, for example, Huang, L-K & Wang, M-J J (1995), "Image thresholding by minimizing the measure of fuzziness", Pattern Recognition 28(1): 41-51.

As shown in the second column from the right end of FIG. 4C, the area ratio of the crystal phase reflecting the second spots in the main phase was in the range of 0.6% to 32% in samples S01 to S22 and was 34% in sample S106 of the comparative example. In consideration of these points and the characteristics of samples S01 to S22, it is preferred that the area ratio of the crystal phase reflecting the second spots in the main phase be set to 33% or less. Also, the area ratio of the crystal phase reflecting the second spots in the main phase is preferably 0.6% or greater and 33% or less, more preferably 1% or greater and 30% or less, and most preferably 3% or greater and 26% or less.

As shown in the column at the right end of FIG. 4C, the maximum grain size of crystals reflecting the second spots in the main phase was in the range of 0.8 nm to 23 nm in samples S01 to S22 and was 30 nm in sample S106 of the comparative example. In consideration of these points and the characteristics of samples S01 to S22, it is preferred that the maximum grain size of crystals reflecting the second spots in the main phase be set to 25 nm or less. Also, the maximum grain size of crystals reflecting the second spots in the main phase is preferably 0.8 nm or greater and 25 nm or less, more preferably 1 nm or greater and 20 nm or less, and most preferably 3 nm or greater and 11 nm or less.

When the area ratio of the crystal phase reflecting the second spots in the main phase and the maximum grain size of crystals reflecting the second spots in the main phase are set to the above-describe preferred ranges, in the main phase, the crystal phase reflecting the second spots can be uniformly dispersed into the crystal phase reflecting the first spots. In other words, in the main phase, the crystal phase (crystal phase in which oxygen octahedrons are tilted) described with reference to FIG. 7(B) can be uniformly dispersed into the crystal phase (crystal phase in which oxygen octahedrons are not tilted) described with reference to FIG. 7(A). As a result, a lead-free piezoelectric ceramic composition having improved characteristics can be obtained.

FIG. 4E shows electron beam incident orientations employed in the transmission electron microscope. FIG. 4E shows example space groups, the magnitude correlation between the a-axis, b-axis, and c-axis, and Miller indices with respect to various types of crystal systems. The electron beam incident direction of the transmission electron microscope is the <100> direction in the case of representation as the pseudo-cubic crystal system, but corresponds to the orientations shown in FIG. 4E in the case of representation as the monoclinic crystal system, the tetragonal crystal system, or the orthorhombic crystal system. For example, in the case where the electron beam incident direction of the transmission electron microscope is represented by means of the tetragonal crystal system (space group P4 mm, c>a=b), the <100> direction of the pseudo-cubic crystal system corresponds to the [100] direction, the [010] direction, or the [001] direction. Notably, FIG. 4E shows example space groups. Space groups are not limited thereto so long as the monoclinic crystal system, the tetragonal crystal system, or the orthorhombic crystal system is the case. FIG. 4E eliminates Miller indices with respect to the opposite orientation of 180°.

FIG. 4F shows the results of an experiment regarding the influence of firing temperature. Sample S17 is the same as sample S17 shown in FIG. 4A. Samples S201 and S202 of the comparative example have the same composition as sample S17 but differ in firing temperature from sample S17. As can be understood from this example, the area ratio of the crystal phase reflecting the second spots in the main phase and the maximum grain size of crystals thereof can be adjusted by changing the firing temperature. Specifically, when the firing temperature is increased, the area ratio of the crystal phase reflecting the second spots in the main phase increases, and the maximum grain size of crystals thereof increases. However, the area ratio and the maximum grain size are also affected by the composition of each sample. Namely, when the composition is constant, the area ratio of the crystal phase reflecting the second spots in the main phase and the maximum grain size of crystals thereof can be adjusted to proper ranges by properly changing the firing temperature.

Notably, the Na/K ratio of the main phase after sintering depends on the mixing ratio between Na and K in mixing material powders and the occupancy percentage (vol. %) of green compacts in the firing sheath. Also, presumably, whether or not there appears the crystal structure of the main phase in which weak spots corresponding to twofold lattice period appears in an electron beam diffraction image depends on the mixing ratio between Na and K in mixing material powders and the occupancy percentage (vol. %) of green compacts in the firing sheath. Therefore, by means of appropriately adjusting the mixing ratio between Na and K in mixing material powders and the occupancy percentage (vol. %) of green compacts in the firing sheath, the main phase can have the crystal structure in which weak spots corresponding to twofold lattice period appears in the electron beam diffraction image, and the main phase can have the Na/K ratio in a desired range after sintering. For example, through employment of an occupancy percentage of green compacts in the firing sheath of 1 vol. % to 30 vol. % and the Na/K ratio (at the time of mixing the material powder) having a value represented by 0.40<(Na/K)<3.0, a preferable piezoelectric ceramic composition can be obtained.

FIGS. 8A and 8B are tables showing experimental results regarding the effects of components of the subphase and the main phase on piezoelectric constant $d_{33}$ and electromechanical coupling factor kr and show the same items as those of FIGS. 4A and 4B with respect to samples S31 to S35, S111, and S112. Sample S31 is the same as sample S05 in FIG. 4A. Of samples S31 to S35, samples S31 to S34 have the same components of the main phase and differ in components of the subphase. The subphase of sample S31 is formed of three types of monometal oxides of $Co_3O_4$, ZnO, and $Fe_2O_3$. The subphase of sample S32 is formed of a spinel compound of $(CoZnFe)_2TiO_4$. The subphase of sample S33 contains an A-Ti—B—O compound ($A_{1-x}Ti_{1-x}B_{1+x}O_5$) of $KTi_{0.85}Nb_{1.15}O_5$ as well as $Co_3O_4$, ZnO, and $Fe_2O_3$. The subphase of sample S34 is formed of an $A_2B_6O_{13}$ compound of $K_2(Ti, Nb, Co, Zn)_6O_{13}$. The subphase of sample S35 is formed of a spinel compound of $CoZnTiO_4$. Sample S35 contains Co and Zn as element E of the main phase.

Samples S31 to S35 shown in FIG. 8B have good piezoelectric constant $d_{33}$ and electromechanical coupling factor kr. Of these samples, samples S31, S32, and S35 have particularly good piezoelectric constant $d_{33}$ and electromechanical coupling factor kr. Notably, samples S31 to S34 have the same Na/K ratio in mixing materials, but slightly differ in the analyzed value of the Na/K ratio after sintering. Therefore, it is understandable that the Na/K ratio after sintering is influenced by subphase components. The most preferable Na/K ratio in view of piezoelectric constant $d_{33}$ and electromechanical coupling factor kr can be experimentally determined as appropriate according to subphase components.

Samples S111 and S112 of the comparative example use, as the main phase, the KNN phase represented by (K, Na, Li)$NbO_h$, and do not contain the subphase. Since these samples S111 and S112 were not sufficiently densified by firing, properties could not be measured.

Notably, it has been confirmed from the backscattered electron images of samples S111 and S112 of the comparative example that a large number of pores are formed between the main phases. By contrast, it has been confirmed that, in all of samples S31 to S35 of the example in FIGS. 8A and 8B and samples S01 to S22 of the example in FIGS. 4A to 4C, a large number of pores formed between the main phases are filled with the subphase. In view of them, preferably, a lead-free piezoelectric ceramic composition is composed of the main phase, and the subphase which fills a large number of pores formed between the main phases. In such a constitution, since pores between the main phases are filled with the subphase to thereby stabilize the structure of the main phase, piezoelectric constant $d_{33}$ and electromechanical coupling factor kr can be improved.

Figure 9A:
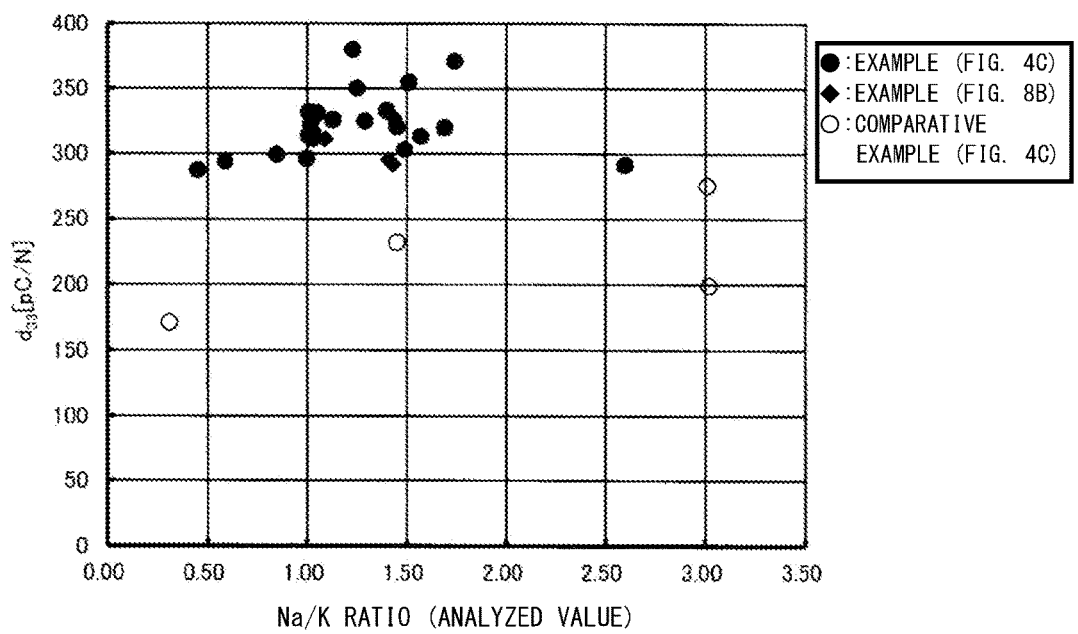
FIG. 9A Graph showing the relation between the Na/K ratio and piezoelectric constant $d_{33}$ with respect to all samples.
Figure 9B:
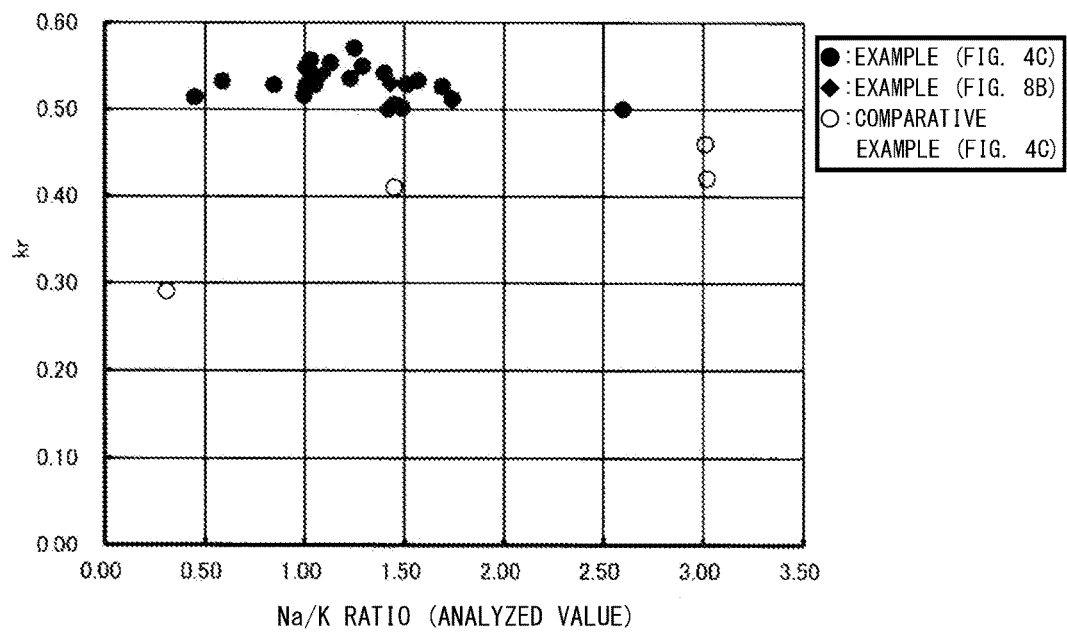
FIG. 9B Graph showing the relation between the Na/K ratio and electromechanical coupling factor kr with respect to all samples.

FIG. 9A is a graph showing the relation between the analyzed Na/K ratio and piezoelectric constant $d_{33}$ with respect to all samples shown in FIGS. 4C and 8B. FIG. 9B is a graph showing the relation between the analyzed Na/K ratio and electromechanical coupling factor kr with respect to all samples shown in FIGS. 4C and 8B. It can also be understood from these graphs that, in view of piezoelectric constant $d_{33}$ and electromechanical coupling factor kr, the Na/K ratio preferably assumes a value in a range represented by 0.40<(Na/K)<3.0, more preferably 1.0<(Na/K)<2.0. Of the samples of the comparative example in FIGS. 9A and 9B, those corresponding to samples S101, S104, and S105 in FIG. 4C are samples in which weak spots corresponding the lattice period two times the primitive lattice period did not appear in electron beam diffraction images obtained by beam injection from the <100> direction of the main phase through the transmission electron microscope.

Notably, samples S01 to S22 and S31 to S35 of the example also have the common feature that Na (sodium) and K (potassium) account for 89 mol. % or more of A-site atoms of the main phase. In this manner, through adjustment of components of the main phase, the main phase having a stable structure can be obtained, whereby a lead-free piezoelectric ceramic composition that is excellent in piezoelectric constant $d_{33}$ and electromechanical coupling factor kr can be provided.

Modifications: The present invention is not limited to the above-described embodiments or modes, but may be embodied in various other forms without departing from the gist of the invention.

DESCRIPTION OF REFERENCE NUMERALS

10: green compact
20: firing sheath
100: piezoelectric ceramic
200: piezoelectric element
310: electrode
302: electrode

The invention claimed is:

1. A lead-free piezoelectric ceramic composition whose main phase is of an alkali niobate/tantalate perovskite oxide having piezoelectric properties and whose subphase is of a metal oxide different from the main phase, wherein:
    the mole ratio (Na/K) between Na (sodium) and K (potassium) in the main phase falls within a range represented by 0.40<(Na/K)<3.0;
    the main phase has a crystal structure in which
    (i) first spots corresponding to a primitive lattice period and
    (ii) second spots corresponding to a lattice period two times the primitive lattice period and being weaker than the first spots appear in an electron beam diffraction image obtained through a transmission electron microscope on the condition that an electron beam enters from the <100> direction with the main phase represented as a pseudo-cubic crystal system; and
    the area ratio of a crystal phase reflecting the second spots in the main phase is 33% or less, and the maximum grain size of crystals reflecting the second spots in the main phase is 25 nm or less.

2. A lead-free piezoelectric ceramic composition according to claim 1, wherein
    the subphase fills pores formed between the main phases.

3. A lead-free piezoelectric ceramic composition according to claim 1, wherein
    the mole ratio (Na/K) assumes a value in a range represented by 1.0<(Na/K)<2.0.

4. A lead-free piezoelectric ceramic composition according to claim 1, wherein
    Na (sodium) and K (potassium) contained in the main phase account for 89 mol % or more of A-site atoms in the perovskite structure of the main phase.

5. A lead-free piezoelectric ceramic composition according to claim 1, wherein
    the alkali niobate/tantalate perovskite oxide is an alkali niobate perovskite oxide.

6. A piezoelectric element comprising
    a piezoelectric ceramic formed of a lead-free piezoelectric ceramic composition according to claim 1, and
    an electrode attached to the piezoelectric ceramic.

7. A method of manufacturing a lead-free piezoelectric ceramic composition according to claim 1, including a compacting step of forming an unsintered green compact of the lead-free piezoelectric ceramic composition and a closed firing step of firing the green compact contained in a sealed condition in a closed container, wherein, in the closed firing step, the occupancy percentage of the volume of the green compact to the capacity of the closed container is 1% to 30%.

* * * * *